United States Patent [19]

Inaba

[11] Patent Number: 5,357,461
[45] Date of Patent: Oct. 18, 1994

[54] OUTPUT UNIT INCORPORATED IN SEMICONDUCTOR INTEGRATED CIRCUIT FOR PREVENTING SEMICONDUCTOR SUBSTRATE FROM FLUCTUATING IN VOLTAGE LEVEL

[75] Inventor: Hideo Inaba, Kanagawa, Japan

[73] Assignee: NEC Corporation, Tokyo, Japan

[21] Appl. No.: 778,653

[22] Filed: Oct. 18, 1991

[30] Foreign Application Priority Data

Oct. 18, 1990 [JP] Japan .................................. 2-279752

[51] Int. Cl.⁵ .......................... G11C 7/00; G11C 7/02
[52] U.S. Cl. ............................... 365/181; 365/189.01; 365/190; 365/148
[58] Field of Search ................... 365/182, 181, 189.01, 365/190, 148

[56] References Cited

U.S. PATENT DOCUMENTS

| | | | |
|---|---|---|---|
| 4,376,986 | 3/1983 | Elmarsy et al. | 365/181 |
| 4,797,804 | 1/1989 | Rockett, Jr. | 365/181 |
| 4,862,018 | 8/1989 | Taylor et al. | 307/443 |

FOREIGN PATENT DOCUMENTS

| | | |
|---|---|---|
| 63-21872 | 1/1988 | Japan . |
| 029093 | 1/1990 | Japan . |
| 03116864 | 5/1991 | Japan . |

Primary Examiner—Eugene R. LaRoche
Assistant Examiner—Viet Q. Nguyen
Attorney, Agent, or Firm—Sughrue, Mion, Zinn, Macpeak & Seas

[57] ABSTRACT

An output circuit is incorporated in an integrated circuit for communicating with an external device, and includes a plurality of output inverting circuits. Each such inverting circuit is implemented by a series combination of a p-channel enhancement type field effect transistor and an n-channel enhancement type field effect transistor. The inverting circuits are coupled between a positive power voltage line and a ground voltage line electrically connected with a semiconductor substrate. The output circuit also includes a plurality of output pins, each coupled between an external load and one of the output inverting circuits, and a resistive element coupled between the ground voltage line and the semiconductor substrate, so that the ground voltage line hardly fluctuates in voltage level upon concurrent switching actions of the output inverting circuits.

7 Claims, 2 Drawing Sheets

OUTPUT UNIT INCORPORATED IN SEMICONDUCTOR INTEGRATED CIRCUIT FOR PREVENTING SEMICONDUCTOR SUBSTRATE FROM FLUCTUATING IN VOLTAGE LEVEL

FIELD OF THE INVENTION

This invention relates to a semiconductor integrated circuit and, more particularly, to an output unit incorporated therein for driving a large amount of capacitive load without any fluctuation in voltage level.

DESCRIPTION OF THE RELATED ART

A semiconductor integrated circuit can communicate with external devices by means of a data output unit, and FIG. 1 shows a typical example of an output unit incorporated in a semiconductor memory device. The semiconductor memory device is fabricated on a single semiconductor substrate 1, and the output unit 2 forms a part of the semiconductor memory device. The output unit 2 is implemented by a plurality of output inverting circuits 2a, 2b and 2c associated with delay circuits 2d, 2e and 2f, respectively. Namely, each of the output inverting circuits 2a to 2c is formed by a series combination of a p-channel enhancement type field effect transistor Qp1 and an n-channel enhancement type field effect transistor Qn2 coupled between a positive power voltage line Vdd and a ground voltage line or the semiconductor substrate 1. The common drain nodes N1, N2 and N3 of the output inverting circuits 2a to 2c are coupled with an output data pins OUT1, OUT2 and OUT3 which in turn are coupled with loads L1, L2 and L3, respectively. Each of the loads L1 to L3 has resistive components R1 and R2 and a capacitive component C1. On the other hand, the gate electrodes of the p-channel enhancement type field effect transistor Qp1 and the n-channel enhancement type field effect transistor Qn2 are coupled with the associated delay circuits 2d to 2f, and the delay circuits 2d to 2f introduce time delay into the propagation of read-out data bits D11, D12 and D13, respectively. The amount of time delay introduced by the delay circuit 2d is different from those of the delay circuits 2e and 2f, and the amount of time delay introduced by the delay circuit 2e is further different from that of the delay circuit 2f. For this reason, the read-out data bits D11 to D13 reach the output inverting circuits 2a to 2c at various intervals, and the output inverting circuits 2a to 2c sequentially drive the loads L1 to L3.

Assuming now that all of the output data pins OUT1 to OUT3 are driven to logic "1" level or a high voltage level, the p-channel enhancement type field effect transistors Qp1 are turned on with read-out data bits of logic "0" level, and the positive power voltage line Vdd is coupled through the p-channel enhancement type field effect transistors Qp1 with the output pins OUT1 to OUT3. In this situation, the capacitive components C1 have been accumulated by the output data pins OUT1 to OUT3. If read-out data bits D11 to D13 of logic "1" level read out from memory cells concurrently reach the delay circuits 2d to 2f, the delay circuits 2d to 2f cause the read-out data bits D11 to D13 to reach the output inverting circuits 2a to 2c at differing intervals, and the n-channel enhancement type field effect transistors Qn2 sequentially turn on. The p-channel enhancement type field effect transistors Qp1 also sequentially turn off, and current flows from the capacitive components C1 through the output data pins OUT1 to OUT3 and the n-channel enhancement type field effect transistors Qn2 into the ground voltage line or the semiconductor substrate 1. However, the capacitive elements C1 are sequentially coupled through the associated n-channel enhancement type field effect transistors Qn2 with the semiconductor substrate 1, and the peak value of the current is relatively low. This results in the ground voltage line being less affected by the current, and, for this reason, the other component circuits of the semiconductor memory device are prevented from malfunctioning.

However, a problem is encountered in the prior art output unit in long access time. This is because of the fact that the delay circuits 2d to 2f introduce the delay time. As the output data pins tend to be increased, the delay can not be ignored.

SUMMARY OF THE INVENTION

It is therefore an important object of the present invention to provide an output unit which minimizes or prevents fluctuations in a constant voltage line without the need to utilize delay times, as described above.

To accomplish these objects, the present invention proposes to couple the resistive element between the constant voltage line and a semiconductor substrate.

In accordance with the present invention, there is provided an output unit incorporated in an integrated circuit fabricated on a semiconductor substrate, comprising: a) a plurality of output inverting circuits each implemented by a series combination of a first transistor of a first channel conductivity type, a common node and a second transistor of a second channel conductivity type coupled between a first voltage line and a second voltage line electrically connected with the semiconductor substrate; b) a plurality of output data pins each coupled with one of the common nodes; and c) a resistive means coupled between the second voltage line and the semiconductor substrate.

BRIEF DESCRIPTION OF THE DRAWINGS

The features and advantages of the output unit according to the present invention will be more clearly understood from the following description taken in conjunction with the accompanying drawings in which.

DESCRIPTION OF THE PREFERRED EMBODIMENT

Figure 1:
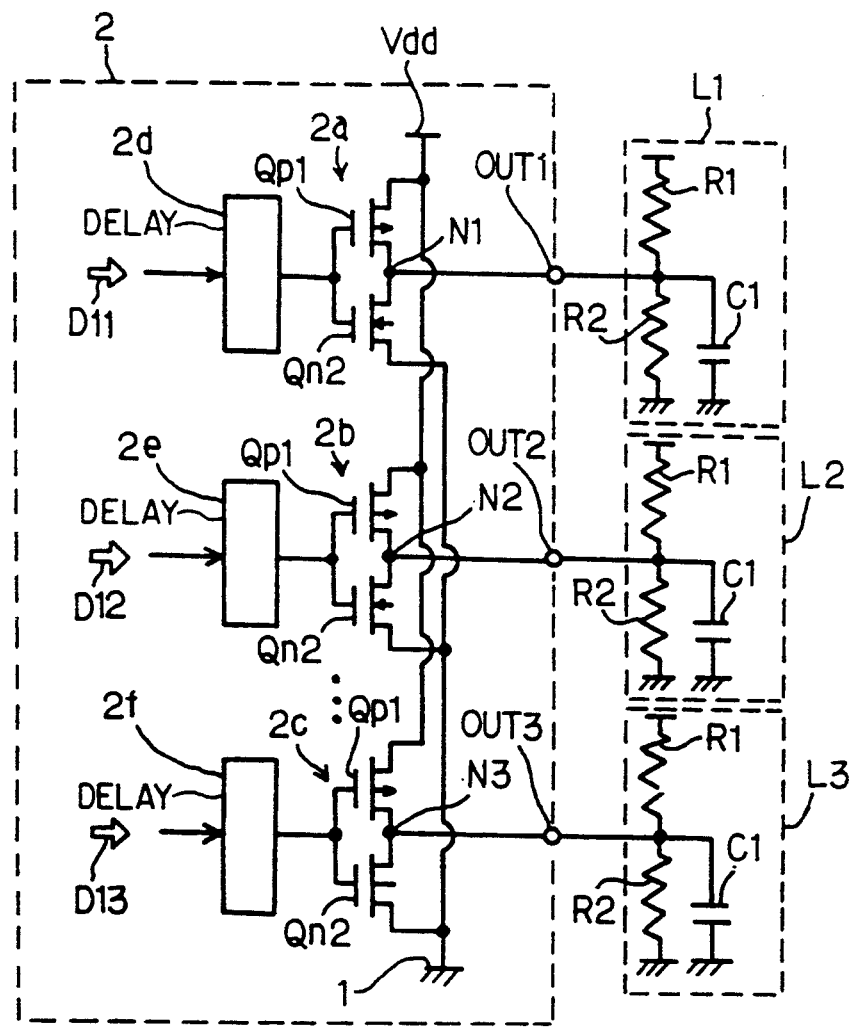
FIG. 1 is a circuit diagram showing the circuit arrangement of the prior art output unit incorporated in a semiconductor memory device.
Figure 2:
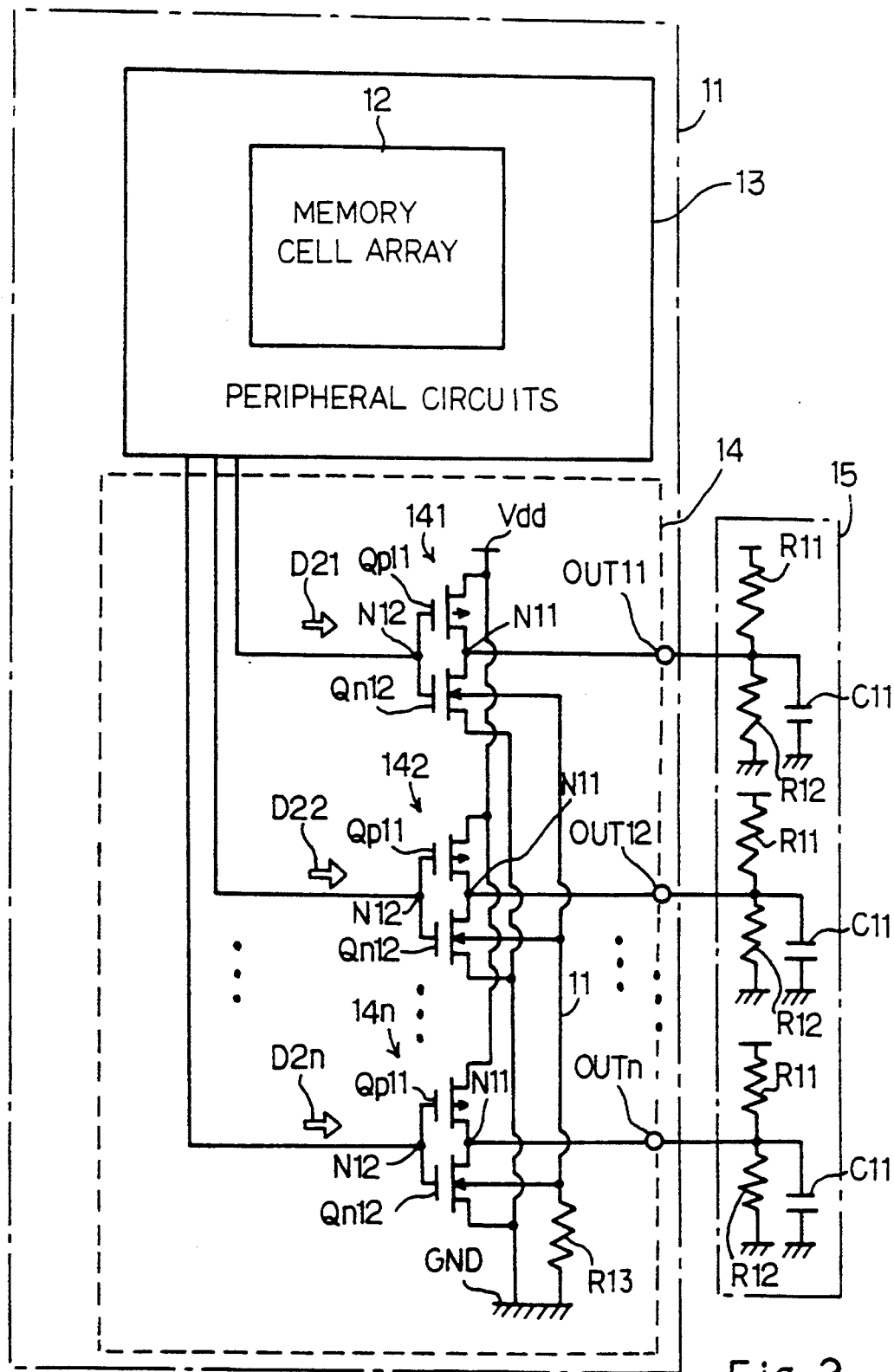
FIG. 2 is a circuit diagram showing the circuit arrangement of an output unit incorporated in a semiconductor memory device according to the present invention.

Referring to FIG. 2 of the drawings, a semiconductor memory device is fabricated on a single lightly doped p-type silicon substrate 11, and largely comprises a memory cell array 12, and peripheral circuits 13, including an output unit 14. The memory cell array 12 memorizes a plurality of data bits, and the peripheral circuits 13 allow an external device 15 to access the data bits. The external device provides a load coupled with output data pins OUT1, OUT2 and OUTn, and the load has resistive components R11 and R12 and capacitive components C11. When the external device 15 accesses the data bits, the peripheral circuits 13 read out the data bits to be accessed, and produce read-out data bits D21, D22 and D2n. The read-out data bits D21 to D2n are supplied to the output unit 14.

The output unit 14 comprises output inverting circuits 141, 142 and 14n coupled between a positive power voltage line Vdd and the ground voltage line GND, and each of the output inverting circuits 141 to 14n is implemented by a series combination of a p-channel enhancement type field effect transistor Qp11 and an n-channel enhancement type field effect transistor Qn12. The common drain nodes N11 are respectively coupled with the output data pins OUT11 to OUTn, and the read-out data bits D21 to D2n are directly supplied to the gate electrodes N12 of the output inverting circuits 141 to 14n respectively. A resistive element R13 is coupled between the ground line GND and the silicon substrate 11, and the resistive element R13 forms a part of the output unit 14.

When fabricating the semiconductor memory device on the silicon substrate 11, the p-channel enhancement type field effect transistors Qp11 are formed in n-type wells (not shown) defined in the silicon substrate 11, and the n-channel enhancement type field effect transistors Qn12 are formed on a major surface portion of the p-type silicon substrate 11. For this reason, the voltage level in the silicon substrate 11 affects the channel conductance of the n-channel enhancement type field effect transistors Qn12 under a certain gate biased state. In other words, a backgate biasing phenomenon has an influence on the n-channel enhancement type field effect transistors Qn12.

If the ground voltage line GND is implemented by a conductive wiring strip (not shown) coupled through appropriate contact holes with the source regions of the n-channel enhancement type field effect transistors Qn12, a highly resistive region or strip may be inserted between the ground voltage line GND and the silicon substrate 11 for providing the resistive element R13. However, if an n-type impurity region (not shown) serves as not only the source regions of the n-channel enhancement type field effect transistors Qn12 but also the ground voltage line GND, the n-type impurity region may be lower in impurity concentration than n-type impurity regions serving as the drain regions of the n-channel enhancement type field effect transistors Qn12 so as to provide the resistive element R13.

Description is hereinbelow made reading the circuit behavior of the semiconductor memory device shown in FIG. 2. Assuming now that the read-out data bits D21 to D2n of logic "0" level have caused the output inverting circuits 141 to 14n to couple the output data pins OUT1 to OUTn with the positive power voltage line Vdd, the p-channel enhancement type field effect transistors Qp11 are turned on, and the n-channel enhancement type field effect transistors Qn12 are turned off. The output data pins OUT1 to OUTn supply output data bits of logic "1" to the external device 15, and the capacitive components C11 are fully accumulated. If the external device 15 changes the address of the memory cell array 12, other data bits are read out from the memory cell array 12, and the peripheral circuits 13 produce the read-out data bits D21 to D2n of logic "1" level. The read-out data bits D21 to D2n concurrently reach the gate electrodes N12 of the output inverting circuits 141 to 14n, and the output inverting circuits 141 to 14n complementarily shift the component field effect transistors Qp11 and Qn12. Namely, the p-channel enhancement type field effect transistors Qp11 turn off to block the output data pins OUT11 to OUT1n from the positive power voltage level Vdd, and the n-channel enhancement type field effect transistors Qn12 turn on so as to provide current path from the output data pins OUT11 to OUTn to the ground voltage line GND. Thus, the output data pins OUT11 to OUT1n are concurrently conducted to the ground voltage line GND. The capacitive components C11 discharge electric charges, and currents flow into the ground voltage line GND. However, the resistive element R13 prevents the silicon substrate 11 from rapidly increasing in voltage level, and the voltage level in the silicon substrate 11 is slowly increased. The silicon substrate 11 propagates the slowly increased voltage level. When the increased voltage level reaches the channel regions of the n-channel enhancement type field effect transistors Qn12, the increased voltage level decreases the channel conductance of each n-channel enhancement type field effect transistor Qn12 and, accordingly, the current passing therethrough. This results in the voltage level in the silicon substrate 11 tracing a gentle slope, and, for this reason, hardly any malfunction takes place in the peripheral circuits 13. However, the propagation of the read-out data bits D21 to D2n is not intentionally delayed, as in the related art described above, and the data bits read-out from the memory cell array 12 are supplied to the external device at high speed.

As will be appreciated from the foregoing description, the output unit according to the present invention improves access speed without any malfunction of the peripheral circuits. This is achieved by virtue of the resistive element coupled between a second or ground voltage line and the silicon substrate.

Although particular embodiments of the present invention have been shown and described, it will be obvious to those skilled in the art that various changes and modifications may be made without departing from the spirit and scope of the present invention. For example, the output unit according to the present invention is applicable to any semiconductor integrated circuit such as, for example, a semicustom-made integrated circuit or a microprocessor.

What is claimed is:

1. An output unit incorporated in an integrated circuit fabricated on a semiconductor substrate, comprising:
   a) a plurality of output inverting circuits, each implemented by a series combination of a first transistor of a first channel conductivity type, a common node and a second transistor of a second channel conductivity type, coupled between a first voltage line and a second voltage line electrically connected with said semiconductor substrate;
   b) a plurality of output data pins each coupled with one of said common nodes; and
   c) a resistive means coupled between said second voltage line and said semiconductor substrate.

2. An output unit as set forth in claim 1, in which said first and second transistors are a p-channel enhancement type field effect transistor and an n-channel enhancement type field effect transistor, respectively, said n-channel enhancement type field effect transistor being formed in a surface portion of said semiconductor substrate.

3. An output unit as set forth in claim 2, in which said first voltage line and said second voltage line supply a positive power voltage level and a ground voltage level to said plurality of output inverting circuits.

4. An output unit as set forth in claim 3, in which said plurality of output inverting circuits are supplied with a multi-bit digital signal.

5. An output unit as set forth in claim 3, in which said multi-bit digital signal is indicative of data information stored in a memory cell array.

6. A semiconductor memory device fabricated on a single semiconductor substrate, comprising:
   a) a memory cell array storing a plurality of data bits;
   b) peripheral circuits allowing an external device to access said data bits, and producing read-out data bits from data bits read out from said memory cell array; and
   c) an output data unit supplied with said read-out data bits, and comprising c-1) a plurality of output inverting circuits, each implemented by a series combination of a first transistor of a first channel conductivity type, a common node and a second transistor of a second channel conductivity type, coupled between a first voltage line and a second voltage line electrically connected with said semiconductor substrate, c-2) a plurality of output data pins each coupled with one of said common nodes for communicating with said external device, and c-3) a resistive means coupled between said second voltage line and said semiconductor substrate.

7. An output unit as set forth in claim 1, in which said first and second transistors are a p-channel enhancement type field effect transistor and an n-channel enhancement type field effect transistor, respectively, said p-channel enhancement type field effect transistor being formed in an n-type well of said semiconductor substrate.

* * * * *